United States Patent
Temmler et al.

(10) Patent No.: US 6,841,443 B2
(45) Date of Patent: Jan. 11, 2005

(54) METHOD FOR FABRICATING A DEEP TRENCH CAPACITOR FOR DYNAMIC MEMORY CELLS

(75) Inventors: Dietmar Temmler, Dresden (DE); Anke Krasemann, Dresden (DE)

(73) Assignee: Infineon Technologies AG, Munich (DE)

( * ) Notice: Subject to any disclaimer, the term of this patent is extended or adjusted under 35 U.S.C. 154(b) by 28 days.

(21) Appl. No.: 10/465,488

(22) Filed: Jun. 19, 2003

(65) Prior Publication Data

US 2004/0023464 A1 Feb. 5, 2004

(30) Foreign Application Priority Data

Jun. 19, 2002 (DE) .......................................... 102 27 492

(51) Int. Cl.⁷ .......................................... H01L 21/8242
(52) U.S. Cl. ..................... 438/243; 438/244; 438/255; 438/386; 438/387; 438/398; 257/301; 257/303; 257/309
(58) Field of Search ................................. 257/301, 303, 257/309; 438/243, 244, 255, 386, 387, 398

(56) References Cited

U.S. PATENT DOCUMENTS

| | | | | |
|---|---|---|---|---|
| 5,877,061 A | * | 3/1999 | Halle et al. ............... | 438/386 |
| 5,981,350 A | * | 11/1999 | Geusic et al. ............. | 438/386 |
| 6,025,225 A | * | 2/2000 | Forbes et al. ............. | 438/243 |
| 6,159,874 A | * | 12/2000 | Tews et al. ............... | 438/253 |
| 6,448,131 B1 | * | 9/2002 | Cabral et al. ............. | 438/243 |
| 6,537,872 B1 | * | 3/2003 | Tsao et al. ............... | 438/244 |
| 6,555,430 B1 | * | 4/2003 | Chudzik et al. ........... | 438/243 |
| 6,734,077 B2 | * | 5/2004 | Forster et al. ............ | 438/386 |

FOREIGN PATENT DOCUMENTS

| | | |
|---|---|---|
| DE | 10100582 | 7/2002 |
| WO | 02056369 | 1/2002 |

OTHER PUBLICATIONS

Saida et al., Embedded Trench DRAMs for Sub–0.10–μm Generation by Using Hemispherical–Grain Technique and LOCOS Collar Process, *IEEE Trans. Semiconductor Manufacturing*, 14 (Aug. 2001) 196.*

* cited by examiner

Primary Examiner—Michael S. Lebentritt
Assistant Examiner—Christian D. Wilson
(74) Attorney, Agent, or Firm—Baker Botts LLP

(57) ABSTRACT

A method for fabricating a deep trench capacitor for dynamic memory cells in which a trench is etched into the depth of a semiconductor substrate, and wherein the interior of the trench is provided with a doping and a dielectric and is filled with a conductive material as an inner electrode. The inner electrode and the dielectric are etched back within a collar region, and a collar is formed using a collar process comprising a collar oxide deposition and etching back of the collar oxide on the substrate surface and in the trench as far as the inner electrode, after which the inner electrode is completed by further steps of depositing and etching back conductive layers. Prior to the doping a masking layer is applied to the collar region of the trench, and this masking layer is removed again before the collar process. Before the dielectric is applied the surface of the lower regions of the trench outside the collar region a layer of grains of conductive material is applied.

17 Claims, 1 Drawing Sheet

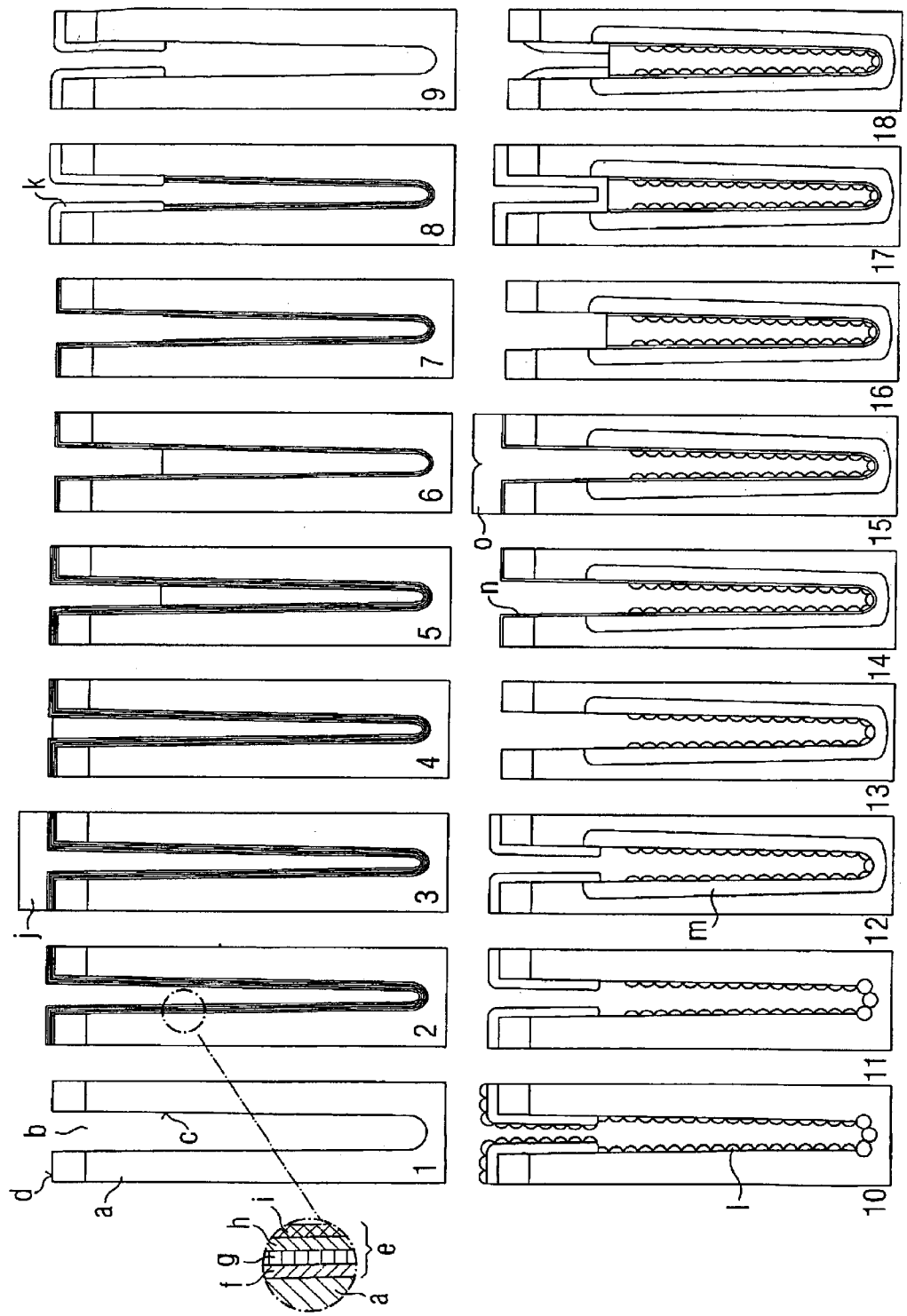

US 6,841,443 B2

METHOD FOR FABRICATING A DEEP TRENCH CAPACITOR FOR DYNAMIC MEMORY CELLS

BACKGROUND OF THE INVENTION

The invention relates to a method for fabricating a deep trench capacitor for dynamic memory cells, in which a trench is etched into a semiconductor substrate. In the interior, i.e., below a collar region near the top surface of the substrate, there is provided a doping and a dielectric. Then, the trench which which includes the doping and dielectric is filled with a conductive material to form an inner electrode. The inner electrode and the dielectric are etched away within the collar region, and a collar is formed using a collar process, comprising a collar oxide deposition and etching back of the collar oxide on the substrate surface and in the trench as far as the inner electrode. Then, the inner electrode is completed by further steps of depositing and etching back conductive layers.

Complex integrated circuits of dynamic memory chips have integrated capacitor structures formed using one of three different designs, planar metal-insulator-silicon, double-polysilicon or metal-insulator-metal capacitors arranged parallel to the semiconductor surface, stacked, three-dimensionally patterned capacitors on the semiconductor surface, known as STCs (stacked capacitors) or three-dimensionally patterned trench capacitors, known as DTCs (deep trench capacitors), which are recessed inside the semiconductor substrate.

In a known trench capacitor, a trench is etched into a semiconductor substrate. In the interior, i.e., below a collar region close to the top surface, the trench is provided with a doping and a dielectric along its surface. This doping is also referred to as plate doping.

In terms of process technology, the doping is produced by outdiffusion out of an As glass layer which has previously been applied to the trench surface in the region of the area which will subsequently act as a capacitor area. To achieve a required doping level, the As glass layer has to have a minimum thickness all the way down to the lower region of the trench. This presents difficulties for feature sizes of less than 130 nm, since the demands for a minimum thickness can no longer be satisfied on account of the high aspect ratio of the trench structure, which is greater than 50, and the fact that the deposition conformity of the As CVD process used to produce the As glass layer is far from ideal.

After the doping, the trench which has been prepared in this way is provided with a dielectric and is then filled with a conductive material as inner electrode, the inner electrode and the dielectric in the region close to the top side are etched back within a collar region, and are then provided with a collar by means of a collar process comprising a collar oxide deposition and etching back the collar oxide on the substrate surface and in the trench as far as the inner electrode. Then, the inner electrode is completed by further steps of depositing and etching back conductive layers.

To improve the storage properties of dynamic memory cells, there is a constant effort to achieve the highest possible capacitance in the capacitors. For this purpose, in the case of STCs, i.e., in the case of the stacked capacitors, it is known to increase the specific capacitance, i.e., the capacitance per unit area. The increase in the capacitance is brought about by increasing the surface area by conductive grains of polysilicon being applied to the base surface of the capacitors. These grains are also known as rugged poly or HSG (hemispherical silicon grains). A use of HSG beyond their application for STCs is not known.

For trench capacitors, there is a wide range of known measures for increasing the capacitance, among which the following are given below:

a relative increase in the trench cross section and therefore also in the size of the trench within the memory cell territory, an increase in the depth of the trench, which has hitherto been the most important measure in capacitor scaling but presenting increasing technical difficulties with scaling of the trench cross section, selecting a bottle-shaped cross section for the trench, known as a bottle shaped capacitor, but this presents increasing etching difficulties in view of the aim to achieve a short distance between the trenches, a reduction in the thickness of the dielectric, but this is limited by incipient charge carrier tunneling, use of dielectrics with a higher dielectric constant, a measure which has not to date gained widespread use on account of difficulties with depositing the material, with integration or with the leakage current characteristics, an increase in the roughness of the (internal) trench surface by means of pore etching (mesopores), which it has not to date been possible to achieve on account of the tight tolerances imposed on the mesopores.

The invention is therefore based on the object of increasing the capacitance of trench capacitors while maintaining the conventional collar process.

SUMMARY OF THE INVENTION

On the one hand, the invention is achieved through the fact that prior to the doping, a masking layer is applied in the upper collar region of the trench, to which the collar is subsequently applied, and this masking layer is removed again before the collar process. This masking layer protects the upper region of the trench, with the result that subsequently a plurality of method steps which increase the capacitance can be carried out.

In one embodiment of the method, there is provision for the masking layer to be formed as an oxide layer which represents an effective mask which is easy to produce.

In one configuration of that method, it is provided that, in succession after the trench has been produced in the silicon substrate, a thin mask layer, which can be removed selectively with respect to the surface of the trench, is deposited on the inner surface of the trench and on the substrate surface, the coated trench is filled with a polymer layer, without any voids being left, the polymer layer is planarized as far as the substrate surface and is etched back to approximately the subsequent collar depth, those regions of the mask layer which are not masked by the polymer layer are removed by means of selective anisotropic etching, selectively with respect to the material of the layer below, until the silicon substrate is uncovered, the entire polymer layer is removed again by means of wet-chemical etching, the uncovered silicon substrate is oxidized by means of thermal oxidation, and in this way the masking layer is formed as an oxide mask consisting of the oxide of the uncovered silicon substrate, and the mask layer which remains in the lower region of the trench is removed selectively.

In an alternative configuration of the method, it is provided that, in succession after the trench has been produced in the silicon substrate, a thin mask layer, which can be removed selectively with respect to the surface of the trench and comprises a layer sequence made up of a first layer, a second layer, an oxidizable third layer and a fourth layer, is deposited on the inner surface of the trench and on the substrate surface, the coated trench is filled with a polymer layer without leaving any voids, the polymer layer is planarized as far as the substrate surface and the polymer layer is etched back approximately to the subsequent collar depth, those regions of the fourth layer of the mask which are not masked by the polymer layer are removed by means of selective anisotropic etching selectively with respect to the material of the layer below, the entire polymer layer is removed again by means of wet-chemical etching, the uncovered silicon substrate is oxidized by means of thermal oxidation, and in this way the masking layer, which consists of the oxide of the third layer, is formed as an oxide mask, and the mask layer which remains in the lower region of the trench is removed selectively.

With this alternative, it is expedient for the first layer to be formed from oxide, for the second layer to be formed from Si nitride, for the third layer to be formed from amorphous silicon and for the fourth layer to be formed from Si nitride.

After the masking layer has been produced, it becomes possible to carry out a bottle etch which widens the trench in the shape of a bottle using the masking layer as an etching mask.

A further option consists in, after the masking layer has been produced, depositing grains in the form of an HSG layer, the HSG layer then being etched back to below the subsequent collar region using the masking layer as a protective mask for the upper region of the trench.

Furthermore, it is expedient to introduce the plate doping by As vapor diffusion using the masking layer as a diffusion-prevention layer.

The required removal of the masking layer may expediently be effected by removing the masking layer by means of a selective wet-chemical etch selectively with respect to the other layer materials of the trench structure.

It is expedient for the polymer layer to consist of photoresist.

On the other hand, the object of the invention is achieved through the fact that, prior to the application of the dielectric, the surface of the regions of the trench outside the collar region which will subsequently have a capacitive action is provided with a layer of grains of conductive material.

This increases the surface area of the trench. Since the dielectric is then also applied to this increased surface area, the increase in the surface area also increases the capacitor area and therefore also the capacitance itself.

It is expedient for the method to be carried out in such a way that the grains consist of polysilicon.

A further embodiment of the method according to the invention consists in the grains, with a dynamic memory cell feature size of less than 130 nm, having a grain size of less than 30 nm. This ensures that the grains do not fill the trench cross section and allow further layers to be introduced.

One possible option consists in the grains being applied selectively. This entails the grains being introduced in a manner which is limited to the region of the trench structure with a capacitive action.

One configuration of the method may considerably reduce the process complexity compared to the selective introduction. In this configuration, there is provision for the collar region, prior to the application of the grains, to be provided with a layer which masks the collar region and for the grains to be removed in the region close to the top side prior to the subsequent processes and for the masking layer to be removed again after the doping. This masking layer enables the coating with the grains initially to be carried out in a non-selective manner, since this coating can then be removed again.

However, the configuration of the method with a masked layer also makes it possible to use other subsequent process steps. For example, in a variant, there is provision for the doping to be produced by means of an As vapor diffusion step. This makes it possible to overcome the difficulty of achieving a minimum As glass layer thickness which arises in particular with feature sizes of less than 130 nm. However, in the case of As vapor diffusion, the collar region has to be reliably masked, which is ensured by the masked layer which is applied in this configuration of the method according to the invention.

The invention is to be explained in more detail below with reference to an exemplary embodiment.

BRIEF DESCRIPTION OF THE DRAWING

The Drawing shows a sequence of steps 1 to 18 in connection with preferred embodiments of the present invention.

DESCRIPTION OF THE PREFERRED EMBODIMENTS

The exemplary embodiment relates to the configuration of the method according to the invention with the non-selective application of grains using a layer which masks the collar region.

In process step 1, a trench structure, i.e. the trench b, is produced in a conventional way in a silicon substrate a. In step 2 a thin mask layer e is deposited on the inner surface c of the trench b and on the substrate top surface d.

The thin mask layer is distinguished by the fact that it can be removed selectively with respect to the surface c of the trench b and is not oxidized or is only oxidized to an insignificant extent during a step of oxidizing the surface c which is required during the further integration process.

In an advantageous embodiment, this thin mask layer e comprises a layer sequence made up of a first layer f, preferably oxide, a second layer g, preferably Si nitride, a third layer h, preferably amorphous silicon, and a fourth layer i, preferably Si nitride.

This layer sequence is distinguished by the fact that the fourth layer i can be removed selectively with respect to the third layer h and is not oxidized or is only oxidized to an insignificant extent during the oxidation of the third layer h which is required during the subsequent integration process, so that it protects the layers below it. The third layer h can be converted by oxidation into a dense oxide layer which is not removed or is only removed to an insignificant extent, when the fourth layer i, the unoxidized regions of the third layer h, the second layer g and first layer f below these regions are being removed. the second layer g is not oxidized or is only oxidized to an insignificant extent during the oxidation of the third layer h which is required in the subsequent integration process, and consequently it also protects the first layer f and the regions lying below it. The first layer f is responsible for good bonding of the layer sequence to the surface c of the trench b below.

In a process step 3, the coated trench b is filled with a polymer layer j of photoresist, without any voids.

Then, in process step 4, the polymer layer j is planarized down to the substrate surface d, and in process step 5 the polymer layer j is etched back to approximately the subsequent collar depth of approx. 1 $\mu$m, measured from the substrate surface d.

The regions of the fourth layer i of the mask layer e, which are not masked by the polymer layer j are removed by means of a selective anisotropic etch, selectively with respect to the layer of material below in process step 6. In process step 7 the entire polymer layer j is removed by means of a wet-chemical etch.

In a method variant, it is also possible to completely remove the mask layer e in the regions which are not masked by the polymer layer j, with the result that the silicon substrate is uncovered.

In process step 8, the uncovered third layer h or the uncovered silicon substrate a is oxidized by means of thermal oxidation. In process step 9 the mask layer e which remains in the lower region of the trench b is removed.

Process steps 8 and 9 lead to the formation of a masking layer as oxide mask k, which consists either the oxide of the third layer h or, according to the method variant, an oxide of the uncovered silicon substrate a, in the upper region of the trench b.

A bottle etch may take place at this point in the method sequence, during which bottle etch the trench b can be widened in the shape of a bottle. This leads to an increase in the surface area in a known way. If a bottle etch of this type is carried out, the oxide mask k serves as an etching mask functioning as a bottle etching mask.

In process step 10, the grains are deposited in the form of an HSG layer 1 by means of a CVD process. In process step 11, the HSG layer is etched back to below the subsequent collar region. During this step, the oxide mask k acts as a protective mask for the upper region of the trench b and thereby fulfils the function of an HSG mask.

In process step 12, the plate doping m is introduced by means of As vapor diffusion. In this step, the oxide layer k acts as a diffusion-prevention layer for the upper region of the trench b, the subsequent collar region. In this case, the oxide layer k fulfils the function of a vapor diffusion mask.

In process step 13, the remaining part of the oxide mask is removed by means of a selective wet-chemical etch k selectively with respect to the other layer materials of the trench structure.

This is followed by the formation of a dielectric layer n in process step 14, the introduction of an inner electrode o in process step 15, the etching back of the inner electrode o to a level above the HSG region of the remaining HSG layer 1 in process step 16. Process steps 15 and 16 are carried out using the procedure which is known in the prior art, as is the subsequent collar process in process steps 17 and 18 and the further completion (not illustrated in more detail) of the trench structure.

We claim:

1. A method for fabricating a deep trench capacitor for dynamic memory cells, wherein a trench is etched into the depth of a semiconductor substrate, wherein said trench includes a collar region adjacent a top surface of said substrate, wherein a lower region of said trench below said collar region is provided with a doping and a dielectric, and said lower region of said trench is filled with a conductive material to form an inner electrode, wherein said inner electrode and said dielectric are etched away in said collar region, and wherein a collar is formed in said collar region by a collar process, including a collar oxide deposition and etching of said collar oxide in said collar region, and wherein said inner electrode is completed in said collar region by depositing and etching conductive layers, wherein prior to said doping of said lower region a masking layer is formed in said collar region, and wherein said masking layer in said collar region is removed prior to forming of said collar by said collar process.

2. The method according to claim 1 wherein said masking layer is formed as an oxide mask.

3. The method according to claim 1, wherein:
   after the trench has been etched in the silicon substrate, a thin mask layer is deposited on an inner surface of the trench and on said top surface, the coated trench is filled with a polymer layer, without any voids;
   the polymer layer is planarized as far as said top surface and is etched away in said collar region;
   those regions of the mask layer which are not masked by the polymer layer are removed by selective anisotropic etching, until the semiconductor substrate is uncovered;
   the entire polymer layer is removed again by means of wet-chemical etching;
   the uncovered semiconductor substrate is oxidized by means of thermal oxidation to form a masking layer as an oxide mask in said collar region; and
   the mask layer which remains in the lower region of the trench is removed selectively.

4. The method according to claim 1, wherein the polymer layer consists of photoresist.

5. The method according to claim 1 wherein:
   after the trench has been produced in the silicon substrate, a thin mask layer, comprising a layer sequence made up of a first layer, a second layer, an oxidizable third layer and a fourth layer, is deposited on an inner surface of the trench and on said top substrate surface;
   the coated trench is filled with a polymer layer without leaving any voids;
   the polymer layer is planarized as far as the substrate surface and is etched back approximately to the subsequent collar depth;
   those regions of the fourth layer of the mask layer which are not masked by the polymer layer are removed by means of selective anisotropic etching;
   the entire polymer layer is removed;
   the uncovered third layer is oxidized by means of thermal oxidation, to form a masking layer, which consists of the oxide of the third layer; and
   the mask layer which remains in the lower region of the trench is removed selectively.

6. The method according to claim 5, wherein the first layer of said layer sequence is formed from oxide, the second layer of said layer sequence is formed from Si nitride, the third layer of said layer sequence is formed from amorphous silicon and the fourth layer of said layer sequence is formed from Si nitride.

7. The method according to claim 1, wherein the polymer layer consists of photoresist.

8. The method according to claim 1, wherein a bottle etch which widens the trench in the shape of a bottle is carried out using the masking layer in the collar region as an etching mask.

9. The method according to claim 1, wherein, after the oxide masking layer has been produced, grains in the form of an HSG layer are deposited, the HSG layer then being etched back to below the subsequent collar region using the masking layer as a protective mask for the upper region of the trench.

10. The method according to claim 1, wherein the doping is introduced by As vapor deposition using the masking layer as a diffusion-prevention layer.

11. The method according to claim 1, wherein the masking layer is removed by means of a wet-chemical etch selectively with respect to the other layer materials of the trench structure.

12. A method for fabricating a deep trench capacitor for dynamic memory cells, wherein a trench is etched into the depth of a semiconductor substrate, wherein said trench includes a collar region adjacent a top surface of said substrate, wherein the trench is provided with a dielectric and wherein an inner electrode is formed within the trench with a conductive material, wherein the inner electrode and the dielectric are etched back within the collar region, and a collar is provided using a collar process, comprising a collar oxide deposition and etching of said collar oxide in said collar region, and wherein the inner electrode is completed by depositing and etching back conductive layers, wherein prior to the application of the dielectric, the surface of the trench outside the collar region which forms a capacitor, there is provided a layer of grains of conductive material.

13. The method according to claim 12, wherein providing the grains consist of providing grains of polysilicon.

14. The method according to claim 12, wherein said dynamic memory cells have a feature size of less than 130 nm, wherein providing said grains comprises providing grains having a grain size of less than 30 nm.

15. The method according to claim 12, wherein providing the grains comprises selectively applying grains.

16. The method according to claim 12, wherein, prior to providing grains, the collar region is provided with a masking layer which masks the collar region, and wherein the grains are removed from the collar region prior to the subsequent processes and wherein the masking layer is removed after doping.

17. The method according to claim 16 wherein doping is provided by As vapor diffusion.

* * * * *